US008098846B2

(12) United States Patent
Wang et al.

(10) Patent No.: US 8,098,846 B2
(45) Date of Patent: Jan. 17, 2012

(54) SOUND FIELD GENERATOR AND METHOD OF GENERATING SOUND FIELD USING THE SAME

(75) Inventors: Semyung Wang, Gwangju (KR); Mincheol Shin, Daejeon (KR)

(73) Assignee: Gwangju Institute of Science and Technology, Gwangju (KR)

( * ) Notice: Subject to any disclaimer, the term of this patent is extended or adjusted under 35 U.S.C. 154(b) by 819 days.

(21) Appl. No.: 12/195,089

(22) Filed: Aug. 20, 2008

(65) Prior Publication Data

US 2009/0052692 A1 Feb. 26, 2009

(30) Foreign Application Priority Data

Aug. 22, 2007 (KR) ........................ 10-2007-0084521

(51) Int. Cl.
*H03G 5/00* (2006.01)

(52) U.S. Cl. .......................... 381/94.3; 704/229; 700/94

(58) Field of Classification Search .......... 381/1, 17–19, 381/73.1, 94.3
See application file for complete search history.

(56) References Cited

U.S. PATENT DOCUMENTS

2006/0025994 A1* 2/2006 Christoph ..................... 704/229
2007/0153888 A1* 7/2007 Kim et al. ..................... 375/229
2007/0239295 A1* 10/2007 Thompson et al. ............. 700/94

OTHER PUBLICATIONS

Kazuhiro Iida et al., "A New Method of Generating Artificial Reverberant Sound", Audio Engineering Society, Oct. 6-9, 1995, Yokohama, Japan.

Wen-Chieh Lee et al., "Fast Perceptual Convolution For Room Reverberation", Proc. of the 6th Int. Conference on Digital Audio Effects (DAFX-03), Sep. 8-11, 2003, London, UK.

Mincheol Shin et al., "Fast Convolution Method Using Perceptual Redundancy For a Sound Field Generator", Gwangju Institute of Science and Technology, Inter-Noise, Aug. 28-31, 2007, Istanbul, Turkey.

* cited by examiner

*Primary Examiner* — Marcos D Pizarro Crespo
*Assistant Examiner* — Sue Tang

(57) ABSTRACT

The invention relates to a sound field generator and a method of generating a sound field using the same. More particularly, the invention relates to a sound field generator and a method of generating the same, which can apply a filter in consideration of a masking effect in a time domain to a room impulse response, remove inaudible data depending on a frequency in a signal obtained by multiplying the room impulse response by an input signal in a frequency domain, and remove a signal block having a lower level than a level of a background noise block among output signal blocks to considerably reduce computational complexity required for performing a convolution, making it possible to generate an accurate sound field by minimizing sound quality distortion while implementing a real-time sound field generating system.

10 Claims, 5 Drawing Sheets

[FIG. 1]
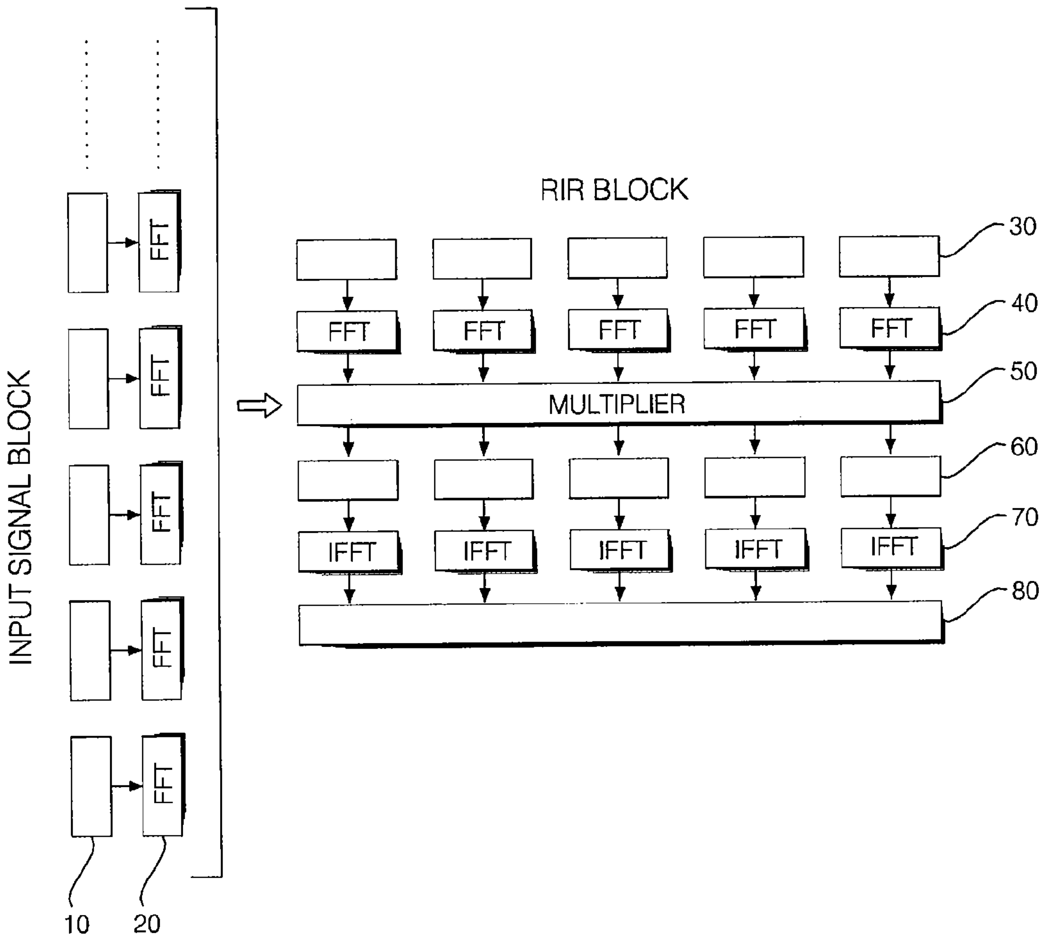

[FIG. 2]
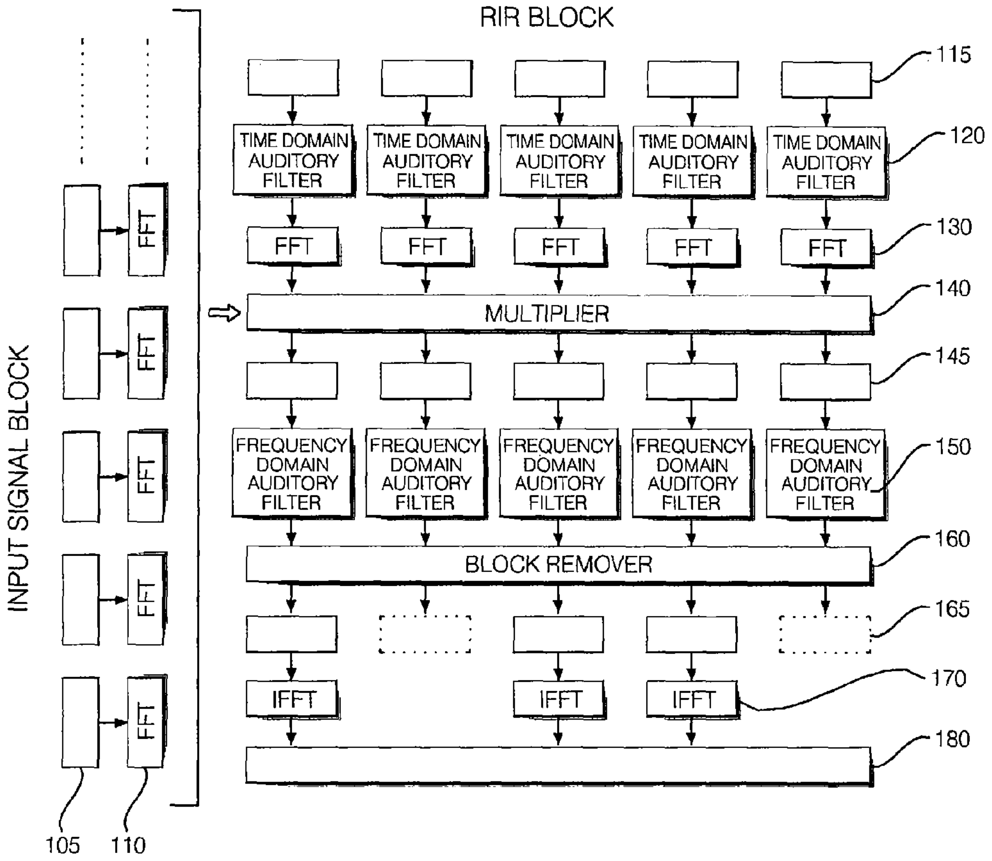

[FIG. 3]
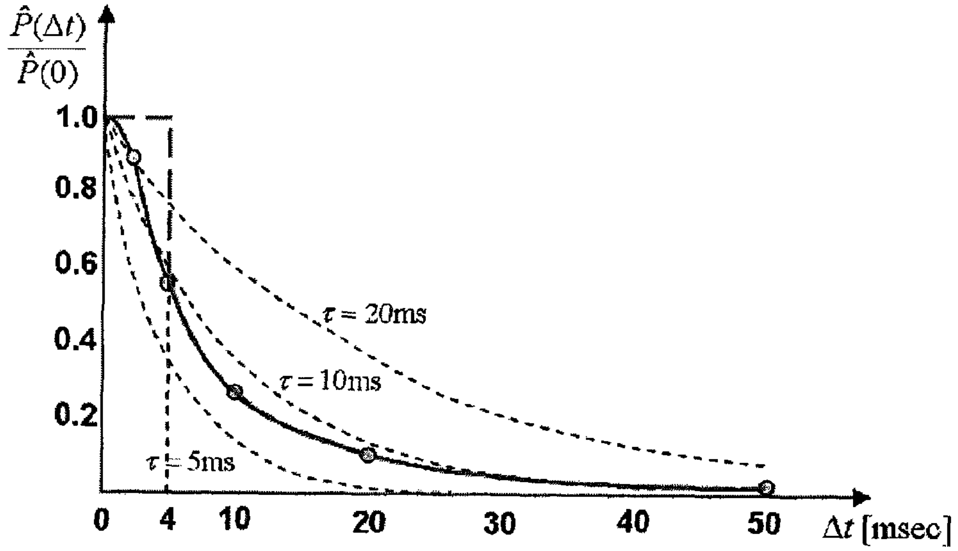

[FIG. 4]
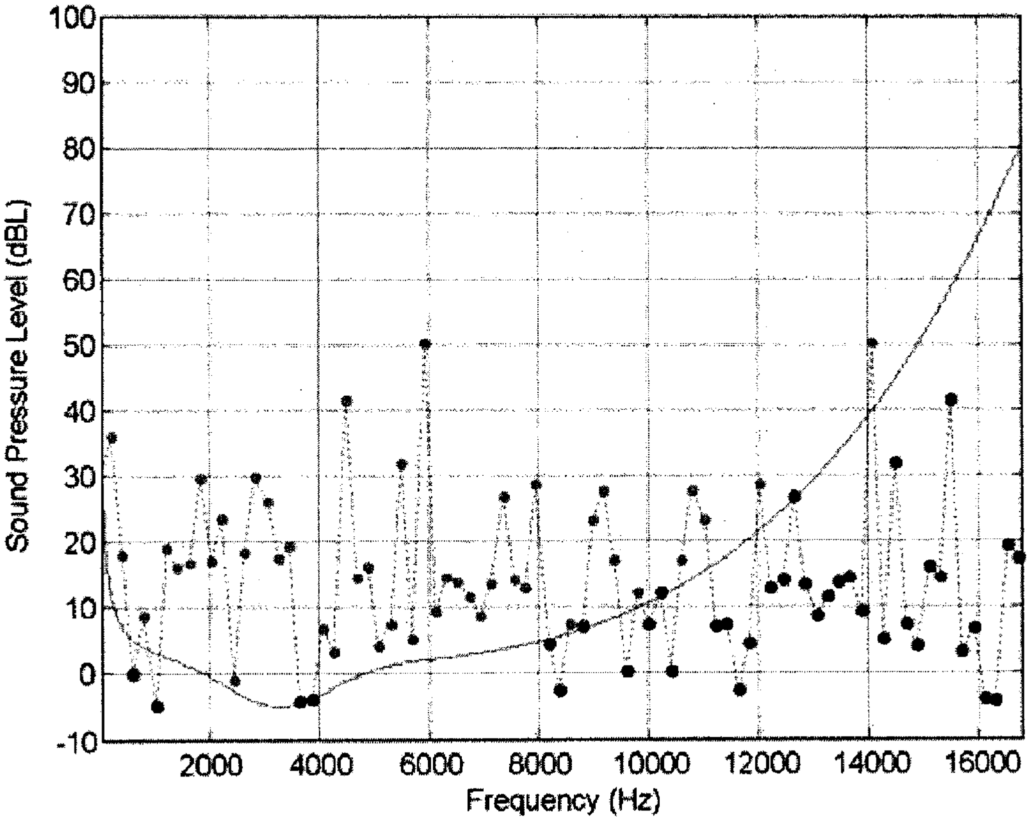

[FIG. 5]
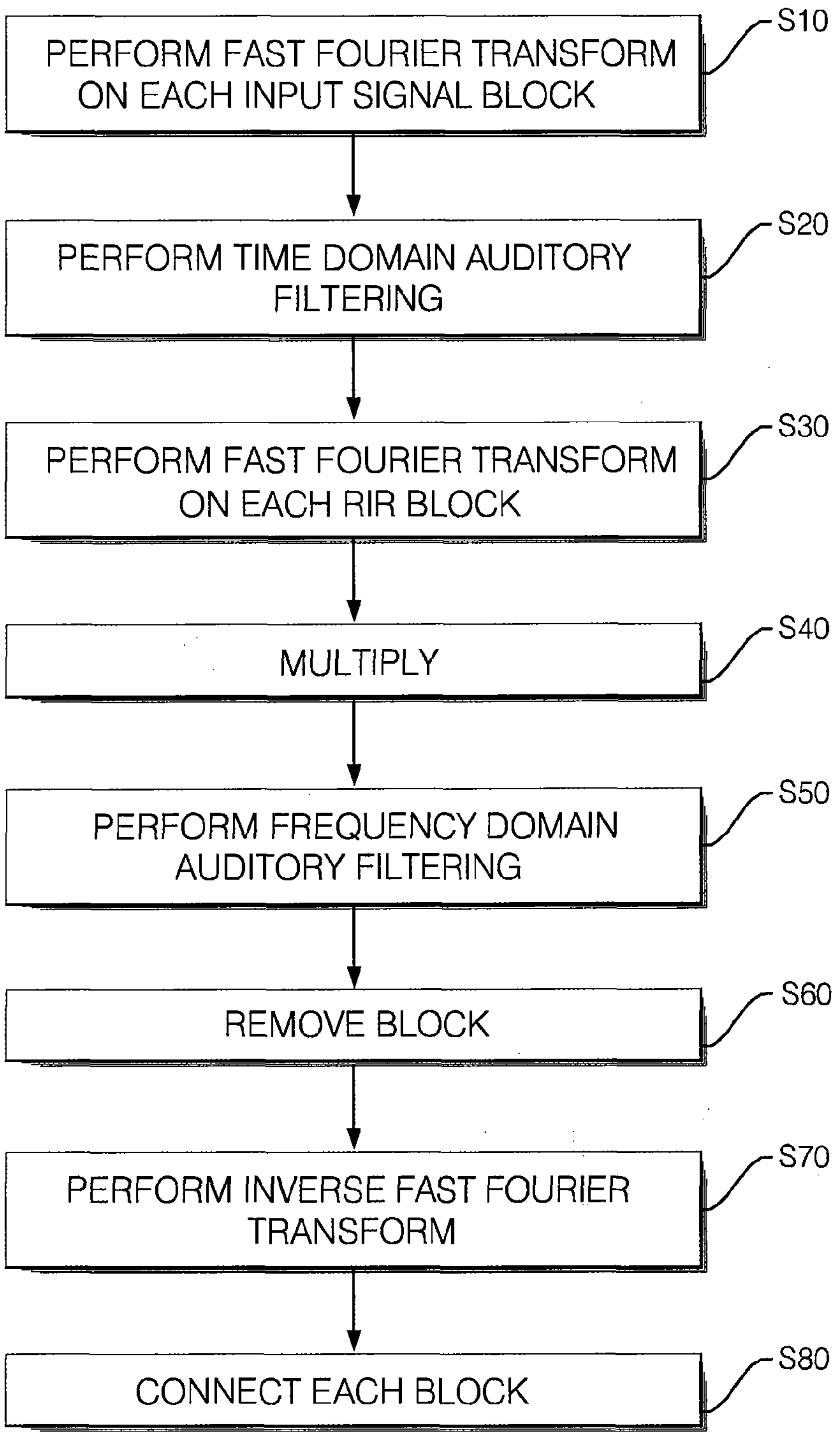

SOUND FIELD GENERATOR AND METHOD OF GENERATING SOUND FIELD USING THE SAME

BACKGROUND OF THE INVENTION

1. Field of the Invention

The present invention relates to a sound field generator and a method of generating a sound field using the same. More particularly, the present invention relates to a sound field generator and a method of generating a sound field using the same, which can apply a filter in consideration of a masking effect in a time domain to a room impulse response, remove inaudible data depending on a frequency in a signal obtained by multiplying the room impulse response by an input signal in a frequency domain, and remove signal blocks having a lower level than a level of background noise blocks among output signal blocks to considerably reduce computational complexity required for performing a convolution, making it possible to generate an accurate sound field by minimizing sound quality distortion while implementing a real-time sound field generating system.

2. Description of the Related Art

A sounder generating a sound field effect in a special space generally performs a convolution operation of a room impulse response (hereinafter, referred to as "RIR") based on a finite impulse response (hereinafter, referred to as "FIR") on a sound signal, when applying the sound field. Comparing to a method based on an infinite impulse response, this method performs a direct convolution on an input signal and the impulse response signal, making it possible to reduce sound quality distortion and obtain the sound field effect approximating the actual sound field effect. However, since this method has enormous computational complexity in respects to a length of the RIR in a specific sound space, it cannot be applied to an apparatus requiring real-time processing.

A block convolution algorithm has been proposed to reduce a delay of computing time and linear convolution operation in the FIR based sound field generating apparatus. The block convolution algorithm divides the input signal and the impulse response signal into several blocks to overcome the above-described problem caused when the RIR is long. The block convolution algorithm can be applied to apparatuses requiring the real-time convolution operation, such as a sound 3D rendering system and a real-time sound player.

FIG. 1 is a block diagram of a block convolution algorithm used in a general FIR based sound field generating apparatus.

The input signal is divided into several input signal blocks 10 and the RIR signal is also divided into several RIR blocks 30. Δt this time, each signal block has the same length. Each input signal block 10 is transformed into a frequency domain by a fast Fourier transform (FFT) 20 and each RIR block 30 is also transformed into a frequency domain by the fast Fourier transform 40. The input signal block and the RIR block transformed into the frequency domain are multiplied in a multiplier 50, which are then output to each signal block 60 and are transformed into a time domain by an inverse fast Fourier transform (IFFT) 70. Each block transformed into the time domain is integrated into one signal so that a sound signal 80 including the sound field effect is produced.

Such a general FIR based sound field generating apparatus repeats the computation at a number of block units several times, as can be seen from FIG. 1, but it does not perform filtering in consideration of human auditory characteristic in each computational step to lead to a problem of enormous computational complexity. Since the general FIR based sound field generating apparatus has enormous computational complexity, its processing speed is slow. Therefore, in order to supplement it, the general FIR based sound field generating apparatus requires an expensive processor and a large-capacity memory, which causes an increase in manufacturing cost.

SUMMARY OF THE INVENTION

Accordingly, the invention has been made to solve the above-mentioned problems. In particular, it is an object of the invention to provide a sound field generator and a method of generating a sound field using the same, which can apply a filter in consideration of a masking effect in a time domain to a room impulse response, remove inaudible data depending on a frequency in a signal obtained by multiplying the room impulse response by an input signal in a frequency domain, and remove signal blocks having a lower level than a level of background noise blocks among output signal blocks to considerably reduce computational complexity required for performing a convolution, making it possible to generate an accurate sound field by minimizing sound quality distortion while implementing a real-time sound field generating system.

In order to achieve the above-described object, according to an aspect of the invention, there is provided an apparatus for generating a sound field using a block convolution. The apparatus includes a first fast Fourier transformer that performs a fast Fourier transform on each input signal block; a time domain auditory filter that filters maskees if a sound pressure of the maskee is equal to or less than a specific threshold at a specific time delay Δt upon inputting each room impulse response block in a time domain, in consideration of a masking effect that can not be sensed by a human auditory sense if the sound pressure of the maskee is equal to or less than the threshold according to the time delay between a masker and the maskee; a second fast Fourier transformer that performs a fast Fourier transform on each room impulse response block passing through the time domain auditory filter; and a multiplier that multiplies each input signal block through the first fast Fourier transformer by each room impulse response block through the second fast Fourier transformer.

According to another aspect of the invention, there is provided a method of generating a sound field using a block convolution. The method includes (a) a step of performing a fast Fourier transform on each input signal block; (b) a step of filtering a maskee if a sound pressure of the maskee is equal to or less than a specific threshold at a specific time delay Δt upon inputting each room impulse response block in a time domain, in consideration of a masking effect that can not be sensed by a human auditory sense if the sound pressure of the maskee is equal to or less than the threshold according to the time delay between a masker and the maskee; (c) a step of performing a fast Fourier transform on each room impulse response block subjected to the step (b); and (d) a step of multiplying each input signal block subjected to the step (a) by each room impulse response block subjected to the step (c).

The invention can increase the processing speed and can be implemented with an inexpensive processor and a small-capacity memory by reducing the computational complexity and prevent the deterioration of sound quality by the reflection of human auditory characteristic, while implementing the real-time sound field control system by the fast processing.

BRIEF DESCRIPTION OF THE DRAWINGS

FIG. 1 is a block diagram of a block convolution algorithm used in a general FIR based sound field generating apparatus;

FIG. 2 is a block diagram of a sound field generating apparatus according to a preferred embodiment of the invention;

FIG. 3 is a graph showing filtering characteristics of a time domain auditory filter;

FIG. 4 is a graph showing human auditory characteristic in a frequency domain for implementing a frequency domain auditory filter according to a preferred embodiment of the invention; and FIG. 5 is a flow chart of a method of generating a sound field according to a preferred embodiment of the invention.

DESCRIPTION OF THE PREFERRED EMBODIMENTS

Hereinafter, the preferred embodiments of the invention will be described in detail with reference to the accompanying drawings. First, it should be noted that reference numerals assigned to each components for each figure, like components are denoted with like numerals, if possible, even though the components are shown in different figures. Also, in describing the invention, detailed descriptions of known configurations or functions are omitted so as not to obscure the gist of the invention. Also, even though the preferred embodiments of the invention will be described below, the technical spirit of the invention is not limited thereto and may be changed by those skilled in the art to be able to be variously practiced.

FIG. 2 is a block diagram of a sound field generating apparatus according to a preferred embodiment of the invention.

Referring to FIG. 2, the sound field generating apparatus according to the preferred embodiment of the invention includes a first fast Fourier transformer 110, a time domain auditory filter 120, a second fast Fourier transformer 130, a multiplier 140, a frequency domain auditory filter 150, a block remover 160, and an inverse fast Fourier transformer 170.

The first fast Fourier transformer 110 receives input signal blocks 105 to transform them into a frequency domain. The input signal blocks 105 are blocks that are divided into a plurality of blocks to allow sound source signals not being added with a sound field effect to have the same length.

The time domain auditory filter 120 receives each room impulse response block 115 (hereinafter, referred to as "RIR block") to remove unnecessary signals in consideration of a masking effect, which is then input to the second fast Fourier transformer 130. Human auditory characteristic indicates the masking effect in a time domain. In the case of an impulse signal, the masking effect indicates the sound pressure ratio of the impulse signal as a specific threshold according to an interval (time delay Δt) between an offset of a specific impulse signal (masker) wanting to obtain and an onset of other impulse signal (maskee). However, it is difficult to sense the maskee having the smaller sound pressure ratio than the threshold through the human auditory sense. Therefore, even though such a signal is filtered through the time domain auditory filter 120, it does not affect the entire sound field generation.

FIG. 3 is a graph showing the filtering characteristics of the time domain auditory filter.

In FIG. 3, a horizontal axis indicates the time delay Δt [msec] and a vertical axis indicates the ratio P(Δt)/P(0) (hereinafter, referred to as "peak pressure ratio") of the peak sound pressure P(Δt) of the maskee to the peak sound pressure P(0) of the masker at Δt=0. Also, the peak sound pressure is a value measured in the case where the masker is white noise, that is, the impulse signal.

The time domain auditory filter 120 is operated through largely two mechanisms.

First, one is a post-masking effect mechanism. The post-masking effect is shown by a curved line (hereinafter, "line 1") including a circle in FIG. 3. When the masker is white noise in the frequency domain, the maskee is indicated by a pressure impulse having a bell shape. The pressure impulse having the bell shape serves as the "specific threshold" determining whether there is masking in each time delay shown on the horizontal axis. In other words, the longer the time from the end of the masker being a signal wanting to obtain to the start of the succeeding signal, the smaller the threshold becomes. As a result, even though the magnitude in the succeeding signal is small, it is keenly sensed by the human auditory sense. On the other hand, as the time delay becomes short, even though the magnitude in the succeeding signal is considerable, it is buried in the masker so that the signal having a smaller magnitude than the threshold may be disregarded.

For example, in the case of the time delay Δt=10 msec, the pressure ratio (specific threshold) of the vertical axis is about 0.28. This means that when the masker ends and the maskee starts after the time delay of 10 msec, if the peak pressure ratio of the maskee is equal to or less than 0.28,it is not sensed by the human auditory sense. If the peak pressure ratio of the succeeding signal exceeds 0.28,it will be sensed by the human auditory sense. Therefore, since the signal having the peak pressure ratio of 0.28 or less is masked by the post-masking effect, even though it is removed by the time domain auditory filter 120, it does not affect the entire sound field generation.

When implementing the time domain auditory filter using the pressure impulse in the bell shape such as the blue line of FIG. 3 as the threshold, it is not easy to precisely adjust the threshold so that the manufacture of the filter is very complicated. Therefore, as an alternative proposal, the pressure impulse in the bell shape can be approximated as represented by the following Equation according to a time constant τ.

$$a_{axp}=\exp(-t/\tau) \qquad \text{[Equation 1]}$$

(where $a_{axp}$ is an approximate value, and τ is a time constant).

The time constant τ is a factor associated with a modeling of a curve portion. Controlling the time constant determines how accurate the masking effect is or how many margins the design of the time domain auditory filter 120 has. Referring to FIG. 3, the time constant reflecting the masking effect is approximately 7.5 ms. Through this, the time domain auditory filter 120 having the masking effect most approximately can be designed. Meanwhile, when the smaller time constant is defined, the filter having more margins can be designed. For example, when the filter is designed to have the time constant τ=5 ms, the computational complexity may be slightly increased as compared to 7.5 ms, but it can be designed so that even a person having an extremely keen auditory sense cannot sense the maskee.

Second, the other is a gap detection threshold (hereinafter, referred to as "GDT") mechanism. The GDT is shown by a straight dotted line and a portion of a curved line (hereinafter, "line 2") in FIG. 3. The line 2 follows the straight dotted line when Δt is 4 msec or less and follows the line 1 when Δt is 4 msec or more. This is represented by a function according to a bandwidth of a white noise channel and can be explained on an extension of the post masking effect. In other words, as the time delay is short, even though the succeeding signal has considerably large sound pressure, it is buried in the masker so that the succeeding signal and the masker cannot be discriminated at the human auditory level. Such an effect remarkably indicates as the time delay is short and a phenomenon that can not be sensed by the human auditory sense occurs regardless of the magnitude in the succeeding signal at a point where time delay is the same as GDT. In other words, unless the magnitude in the succeeding signal from 0 msec to GDT is larger than the sound pressure of the masker, even though the sound pressure exceeds the threshold, the succeeding signal is masked by the masker and therefore, even when it is removed, it does not affect the sound field generation.

The distinct division of the GDT mechanism region and the post-masking effect mechanism based on GDT may involve slight risks. As an alternative proposal, a method of reducing the GDT mechanism region and widening the post-masking effect mechanism region may be used. In the GDT mechanism region, since all the succeeding signals are removed regardless of the threshold, finding out a point of compromise slightly reducing the GDT mechanism region, with leaving a predetermined margin, is safer. FIG. 3 shows a case where the margin is set to 1 msec. In other words, GDT is 5 msec, but the GDT mechanism region is set to 0 to 4 msec by securing the margin of 1 msec and the post-masking effect mechanism is set after 4 msec.

To sum up, the time domain auditory filter 120 may be implemented only by the post-masking effect mechanism. However, when the time delay is short in the post-masking effect mechanism, since the phenomenon that all the succeeding signals are masked occurs regardless of the threshold, it is more preferable that the useless signals are removed as maximally as possible to reduce the computational complexity and the GDT mechanism is added to the post-masking effect mechanism to implement the time domain auditory filter 120. The time domain auditory filter 120 implemented as above is operated as follows. When the time delay is within 4 msec, the time domain auditory filter 120 removes all signals equal to or less than the sound pressure of the masker, among the succeeding signals. When the time delay exceeds 4 msec, the time domain auditory filter 120 passes the succeeding signals in the case where they exceed the specific threshold in the corresponding time delay and removes the succeeding signals in the case where they are equal to or less than the specific threshold. Through this, the time domain auditory filter 120 adaptively corresponds to the time delay of RIR to reflect the human auditory characteristic, thereby reducing the computational complexity of the sound field generating apparatus.

The second fast Fourier transformer 130 performs the fast Fourier transform on each RIR block passing through the time domain auditory filter 120 and transforms them into the frequency domain.

The multiplier 140 performs a function of multiplying each input signal block transformed into the frequency domain through the first fast Fourier transformer 110 by each RIR block transformed into the frequency domain through the second fast Fourier transformer 130. Since a convolution operation of the impulse response and the input signal in the time domain is equivalent to the multiplication of the impulse response and the input signal in the frequency domain, the multiplier 140 performs a simple operation, which is the multiplication of each corresponding block, to reflect actual sound space characteristic to the input signal blocks corresponding to the sound sources, thereby outputting each signal block 145 added with the sound field effect.

The frequency domain auditory filter 150 receives each signal block 145 via the multiplier 140 to remove inaudible data through the human auditory sense depending on the frequency, which is then input to the block remover 160. The filtering by the time domain auditory filter 120 is directly performed on the RIR block 115, while the filtering by the frequency domain auditory filter 150 is performed on the signal block that the RIR block and the input signal block are multiplied in the frequency domain. There is the threshold of the sound pressure that cannot be sensed by the human auditory sense according to each frequency in the frequency domain, such that it is impossible to listen to the signal having the smaller sound pressure than the threshold. Therefore, even though the signal is filtered through the frequency domain auditory filter 150, it does not affect the entire sound field generation.

FIG. 4 is a graph showing the human auditory characteristic in the frequency domain for implementing the frequency domain auditory filter according to a preferred embodiment of the invention.

In FIG. 4, a horizontal axis indicates a frequency [Hz] and a vertical axis indicates a sound pressure level [dBL] in a state where there is no background noise. Also, in FIG. 4, a curved line indicates threshold, a circle (hereinafter, "circle 1") above a curved line indicates audible data, a circle (hereinafter, "circle 2") below a curved line including a curved line indicates inaudible data.

Each signal block 145 involves useless data based on the human auditory sense even in the frequency domain. Therefore, as shown in FIG. 4, the frequency domain auditory filter 150 is implemented reflecting hearing threshold in quiet in the state where there is no background noise. The possibility to listen to the signal in the frequency domain may be determined as a function for "threshold in the state where there is no background noise" (hereinafter, referred to as "threshold") $T_q(f)$ [dB]. Before an inverse fast Fourier transform is performed through the inverse fast Fourier transformer 170, each sample is compared with the threshold $T_q(f)$ in the frequency domain auditory filter 150 to pass data (circle 2 in FIG. 4) having the sound pressure level larger than the threshold and to filter data (circle 1 in FIG. 4) having the sound pressure level smaller than the threshold. This is represented by the following Equation.

$$Y_P^{aud}[k]=Y_P[k] \text{ (In case of } Y_P[k]>T_q[k])$$

$$Y_P^{aud}[k]=0 \text{ (In case of } Y_P[k]<[k]) \qquad \text{[Equation 2]}$$

In this case, $Y_P^{aud}[k]$ means the sound pressure level of the block P having audible data at a $k^{th}$ sample and $Y_P[k]$ means the sound pressure level of the block P at the $k^{th}$ sample. When $Y_P[k]>T_q[k]$, that is, the data having the sound pressure level larger than the threshold are maintained as they are as the audible data and when $Y_P[k]<T_q[k]$, that is, the data having the sound pressure level smaller than the threshold are handled as the absence of the audible data.

For example, in FIG. 4; since all of 10 sampled data have the sound pressure level larger than the threshold at 4000 to 6000 Hz, they are audible data and pass through the frequency domain auditory filter 150. However, since only 5 data among the 10 sampled data have the sound pressure level larger than the threshold at 8000 to 10000 Hz, the remaining five data are filtered by the frequency domain auditory filter 150.

The block remover 160 removes the signal blocks having a lower value than the average sound pressure level of the background noise blocks having the same length as the signal block, among each signal block output from the frequency-region auditory filter 150. There is a difference in that the time domain auditory filter 120 and the frequency domain auditory filter 150 filters the signals in a data unit while the block remover 160 filters the signals in a block unit. The operation of the block remover 160 is represented by the following Equation.

$$\begin{cases} Y_p^{out}[k] = Y_p^{aud}[k] \ldots \frac{1}{N}\sum_{k=0}^{N-1} Y_p^{aud}[k] > \frac{1}{N}\sum_{k=0}^{N-1} BN[k] \\ Y_p^{out}[k] = 0 \ldots \frac{1}{N}\sum_{k=0}^{N-1} Y_p^{aud}[k] < \frac{1}{N}\sum_{k=0}^{N-1} BN[k] \end{cases} \quad \text{[Equation 3]}$$

In this case, $Y^{out}{}_P[k]$ means the sound pressure level of the output block P at a $k^{th}$ sample, BN means the background noise having the same length as the block P, and N means the length of the output block in the frequency domain.

In Equation 3,whether the given output signal blocks are maintained is determined by comparing them with the average sound pressure level of the background noise. In other words, when the average sound pressure level of the corresponding signal blocks is larger than the average sound pressure level of the background noise, the corresponding blocks are maintained as they are as the audible blocks and otherwise, the corresponding blocks are removed. In other words, the signal blocks having a lower level than the level of the background noise blocks among the output signal blocks are buried in the background noise so that they cannot be listened based on the human auditory sense. As a result, such blocks are removed through the block remover 160, making it possible to reduce the computational complexity and prevent the sound quality distortion.

To sum up, the mechanism for reducing the computational complexity in the frequency domain is summarized into two.

First, the inaudible data depending on the frequency in the signals multiplying the RIR by the input signal in the frequency domain are removed through the frequency domain auditory filter 150.

Second, the signal blocks having a lower level than the level of the background noise block among the signal blocks output from the frequency domain auditory filter 150 are removed through the block remover 160.

Meanwhile, both mechanisms can be of course implemented by the frequency domain auditory filter 150.

The performance of the sound field generating apparatus according to the preferred embodiment of the invention is compared with other cases through several tests. The test results are represented in the following Table 1.

TABLE 1

| Signal form | | Convolution method A | B | C | D | E |
|---|---|---|---|---|---|---|
| Bathroom | Barking of dog | 720000000 | 29421459 | 153237 | 13068494 | 78105 |
| | Live voice | | | | 10184944 | 55657 |
| | Music | | | | 23353668 | 53770 |
| Large room | Barking of dog | 480000000 | 19614306 | 102158 | 18046601 | 80849 |
| | Live voice | | | | 16555996 | 61011 |
| | Music | | | | 17141958 | 61038 |

A: linear convolution
B: block convolution
C: block convolution including time domain auditory filter
D: block convolution including frequency domain auditory filter
E: block convolution according to preferred embodiment of the invention In Table 1,the performance of the sound field generating apparatus is determined by the computational complexity, wherein the computational complexity is based on the number of multiplication operations which affects the power consumption required for processing in a digital signal processor.

Referring to Table 1,the block convolution according to the preferred embodiment of the invention to which the time domain auditory filter and the frequency domain auditory filter are applied shows the remarkable reduction of the computational complexity, regardless of kinds of systems (bathroom and large room) and sound source signals (barking of a dog, live voice, music). The reduction of the computational complexity means that the processing speed can be increased, the inexpensive processor and the small-capacity memory can be applied, and the real-time sound field generating system can be appropriately implemented.

Next, a method of generating a sound field according to the preferred embodiment of the invention will be described.

FIG. 5 is a flow chart of a method of generating a sound field according to the preferred embodiment of the invention.

Referring to FIG. 5, the method of generating a sound field according to the preferred embodiment of the invention includes a step (S10) of performing a fast Fourier transform on each input signal block to transform them into a frequency domain; a step (S20) of performing an auditory filtering on each RIR block in a time domain; a step (S30) of performing the fast Fourier transform on each RIR block subjected to the auditory filtering in the time domain to transform them into a frequency domain; a step (S40) of multiplying each input signal block transformed into the frequency domain by each RIR block; a step (S50) of performing the auditory filtering on each of the multiplied signal blocks in the frequency domain; a step (S60) of removing signal blocks having an average sound pressure level lower than an average sound pressure level of background noise blocks having the same length as the signal block, among the signal blocks subjected to the auditory filtering in the frequency domain; a step (S70) of performing an inverse fast Fourier transform on each of the passed signal blocks without being removed in the block removing step to transform them into the time domain; and a step (S80) of connecting each signal block transformed into the time domain to each other to produce output signals.

The step S10 is performed through the first fast Fourier transformer 110.

The step S20 is performed in the time domain auditory filter 120. The filter 120 receives each RIR block in the time domain to filter the signals, which have the sound pressure equal to or less than the specific threshold at the specific time delay Δt and thus, are not sensed by the human auditory sense and filters the signals that can not be sensed by the human auditory sense even when they exceeds the threshold, unless they are larger than the sound pressure of the masker in the case where the time delay Δt is within the specific time gap.

The step S30 is performed through the second fast Fourier transformer 130.

The step S40 is performed through the multiplier 140.

The step S50 is performed in the frequency domain auditory filter 150, which removes the inaudible data through the human auditory sense depending on the frequency for each signal block.

The step S60 is performed through the block remover 160.

The step S70 is performed through the inverse fast Fourier transformer 170.

The method of generating a sound field according to the preferred embodiment of the invention is fully described in the sound field generating apparatus and therefore, the detailed description thereof will be omitted herein.

Although the technical spirit of the invention has been described only by way of example, it would be appreciated by those skilled in the art that various changes, modifications, and substitutions might be made in this embodiment without departing from the essential features of the invention. The disclosed embodiments in the invention and the accompanying drawings are illustrated for explaining rather than limiting the technical spirit of the invention and therefore, the technical scope and spirit of the invention are not limited to these embodiments and the accompanying drawings. The scope of the invention is to be construed by the appended claims and all the technical spirit within their equivalents is to be construed to be covered by the scope of the invention.

The sound field generating apparatus according to the embodiment of the invention is mounted on a sounder to lower the sounder price and enhance its performance and can be applied to application fields using the sound convolution, including a three-dimensional virtual acoustic field.

What is claimed is:

1. An apparatus for generating a sound field using a block convolution, the apparatus comprising:

a first fast Fourier transformer that performs a fast Fourier transform on each input signal block;

a time domain auditory filter that filters maskees if a sound pressure of the maskee is equal to or less than a specific threshold at a specific time delay Δt upon inputting each room impulse response block in a time domain, in consideration of a masking effect that can not be sensed by a human auditory sense if the sound pressure of the maskee is equal to or less than the threshold according to the time delay between a masker and the maskee;

a second fast Fourier transformer that performs a fast Fourier transform on each room impulse response block passing through the time domain auditory filter; and a multiplier that multiplies each input signal block through the first fast Fourier transformer by each room impulse response block through the second fast Fourier transformer.

2. The apparatus of claim 1, wherein the threshold approximated by the following equation is applied, $$a_{axp}=\exp(-t/\tau)$$

(where $a_{axp}$ is an approximate value, τ is a time constant).

3. The apparatus of claim 1, wherein the time domain auditory filter filters signals within gap detection threshold if the signals are not larger than the sound pressure of the masker, in consideration of the gap detection thereshold that can not be sensed by the human auditory sense even when the sound pressure of the maskee exceeds the threshold in the case where the time delay Δt is within a specific time gap.

4. The apparatus of claim 3, wherein the time domain auditory filter filters the maskees before reference time and filters only the maskees having the sound pressure equal to or less than the threshold after the reference time, using time shorter than the gap detection threshold as the reference time.

5. The apparatus of claim 1, further comprising:

a frequency domain auditory filter that receives each signal block through the multiplier to remove inaudible data through the human auditory sense depending on the frequency.

6. The apparatus of claim 5, further comprising:

a block remover that removes signal blocks having an average sound pressure level lower than an average sound pressure level of background noise blocks having the same length as the signal block, among each signal block output from the frequency domain auditory filter.

7. A method of generating a sound field using a block convolution, the method comprising:

(a) a step of performing a fast Fourier transform on each input signal block;

(b) a step of filtering a maskee if a sound pressure of the maskee is equal to or less than a specific threshold at a specific time delay Δt upon inputting each room impulse response block in a time domain, in consideration of a masking effect that can not be sensed by a human auditory sense if the sound pressure of the maskee is equal to or less than the threshold according to the time delay between a masker and the maskee;

(c) a step of performing a fast Fourier transform on each room impulse response block subjected to the step (b); and, (d) a step of multiplying each input signal block subjected to the step (a) by each room impulse response block subjected to the step (c).

8. The method of claim 7, wherein the step (b) filters signals within gap detection threshold if the signals are not larger than the sound pressure of the masker, in consideration of the gap detection threshold that can not be sensed by the human auditory sense even when the sound pressure of the maskee exceeds the threshold in the case where the time delay Δt is within a specific time gap.

9. The method of claim 7 or 8, further comprising:

for each signal block subjected to the step (d), (e) a step of removing inaudible data through the human auditory sense depending on a frequency.

10. The method of claim 9, further comprising:

(f) a step of removing signal blocks having an average sound pressure level lower than an average sound pressure level of background noise blocks having the same length as the signal block, among each signal block subjected to the step (e).

* * * * *